US011804501B2

(12) United States Patent
Ge et al.

(10) Patent No.: US 11,804,501 B2
(45) Date of Patent: Oct. 31, 2023

(54) ALD PREPARATION METHOD FOR ELIMINATING CAMERA MODULE DOT DEFECTS AND PRODUCT THEREOF (71) Applicant: HANGZHOU MDK OPTO ELECTRONICS CO., LTD, Hangzhou (CN)

(72) Inventors: Wenzhi Ge, Hangzhou (CN); Yiwei Wang, Hangzhou (CN); Gang Wang, Hangzhou (CN); Kevin Weng, Hangzhou (CN); Hirokazu Yajima, Hangzhou (CN); Junnan Jiang, Hangzhou (CN)

(73) Assignee: HANGZHOU MDK OPTO ELECTRONICS CO., LTD, Hangzhou (CN)

( * ) Notice: Subject to any disclaimer, the term of this patent is extended or adjusted under 35 U.S.C. 154(b) by 749 days.

(21) Appl. No.: 16/969,573

(22) PCT Filed: May 18, 2020

(86) PCT No.: PCT/CN2020/090839
§ 371 (c)(1),
(2) Date: Aug. 13, 2020

(87) PCT Pub. No.: WO2021/082402
PCT Pub. Date: May 6, 2021

(65) Prior Publication Data
US 2022/0302200 A1 Sep. 22, 2022

(30) Foreign Application Priority Data

Nov. 1, 2019 (CN) .......................... 201911060808.8
Dec. 30, 2019 (CN) ........................ 201911387147.X (51) Int. Cl.
C23C 16/02 (2006.01)
C23C 16/40 (2006.01)
(Continued)

(52) U.S. Cl.
CPC .... H01L 27/14618 (2013.01); C23C 16/0227 (2013.01); C23C 16/402 (2013.01);
(Continued)

(58) Field of Classification Search
CPC ............ C03C 17/3417; C03C 17/3452; C23C 16/0227; C23C 16/30; C23C 16/402;
(Continued)

(56) References Cited

U.S. PATENT DOCUMENTS

2011/0133061 A1* 6/2011 Yu ..................... H01L 31/02327
385/124
2014/0106070 A1* 4/2014 Mantymaki ............. C23C 16/30
427/255.39
(Continued)

FOREIGN PATENT DOCUMENTS

CN 101560653 A 10/2009
CN 103773083 A 5/2014
(Continued)

Primary Examiner — Amy R Hsu
(74) Attorney, Agent, or Firm — Bayramoglu Law Offices LLC (57) ABSTRACT An ALD preparation method for eliminating camera module dot defects includes: placing a base substrate in a reaction chamber, and heating to 100-400° C.; introducing a first reaction precursor into the reaction chamber to chemically adsorb the first reaction precursor on the base substrate to form a first film layer; removing the excess first reaction precursor, and purging with inert gas; introducing a second reaction precursor into the reaction chamber to create a reaction between the second reaction precursor and the first reaction precursor to form a first refractive index layer;

(Continued)

removing the excess second reaction precursor and a by-product of the reaction, and purging with inert gas; introducing a third reaction precursor into the reaction chamber to chemically adsorb the third reaction precursor on a surface of the first refractive index layer to form a second film layer; and removing the excess third reaction precursor, and purging with inert gas.

20 Claims, 4 Drawing Sheets

(51) Int. Cl.
    *C23C 16/455*     (2006.01)
    *H04N 23/54*     (2023.01)
    *H01L 27/146*     (2006.01)

(52) U.S. Cl.
    CPC .......... *C23C 16/403* (2013.01); *C23C 16/405* (2013.01); *C23C 16/45536* (2013.01); *C23C 16/45553* (2013.01); *C23C 16/45555* (2013.01); *H01L 27/14625* (2013.01); *H01L 27/14643* (2013.01); *H01L 27/14685* (2013.01); *H04N 23/54* (2023.01); *H01L 27/14689* (2013.01)

(58) Field of Classification Search
    CPC . C23C 16/403; C23C 16/405; C23C 16/4408; C23C 16/45523; C23C 16/45536; C23C 16/45553; C23C 16/45555; C23C 16/52; C23C 16/56; C23C 28/042; C23C 28/42; C23C 28/44; H01L 27/14618; H01L 27/14625; H01L 27/14643; H01L 27/14685; H01L 27/14689; G02B 5/285; H04N 23/54

See application file for complete search history.

(56) References Cited

U.S. PATENT DOCUMENTS

| | | | | |
|---|---|---|---|---|
| 2014/0377963 | A1* | 12/2014 | Ellinger | ............ H01L 21/02642 438/763 |
| 2016/0197292 | A1* | 7/2016 | Lee | .................... C23C 16/45525 428/688 |
| 2017/0199307 | A1* | 7/2017 | Hart | ..................... C03C 17/3435 |
| 2019/0186008 | A1* | 6/2019 | Tutt | .................. C23C 16/45551 |

FOREIGN PATENT DOCUMENTS

| | | |
|---|---|---|
| CN | 110058342 A | 7/2019 |
| CN | 110767668 A | 2/2020 |
| CN | 110885972 A | 3/2020 |
| WO | 2004075289 A1 | 9/2004 |

\* cited by examiner

ALD PREPARATION METHOD FOR ELIMINATING CAMERA MODULE DOT DEFECTS AND PRODUCT THEREOF

CROSS REFERENCE TO THE RELATED APPLICATIONS

This application is the national phase entry of International Application No. PCT/CN2020/090839, filed on May 18, 2020, which is based upon and claims priority to Chinese Patent Application No. 201911060808.8, filed on Nov. 1, 2019; and No. 201911387147.X, filed on Dec. 30, 2019, the entire contents of which are incorporated herein by reference.

TECHNICAL FIELD

The present invention relates to the technical field of camera modules, and more particularly, to an atomic layer deposition (ALD) preparation method for eliminating camera module dot defects and a product thereof.

BACKGROUND

The optical lens and camera module industry is being driven by high-definition camera imaging demands needed in intelligent terminals, scanners, smartphones, projectors, in-vehicle products, security monitoring and other industries, as well as the broad application of augmented reality, three-dimensional (3D) technology and gesture recognition technology in the field of artificial intelligence.

Dots are a kind of undesirable defect that appears in an optical lens and camera module. Dots refer to a dot-shaped protrusion formed on the substrate surface and are sometimes called particles. During current optical coating processes, including vacuum thermal evaporation and magnetron sputtering, large particle film material dots are inevitably deposited on the substrate surface along with film vapor or sputtered particles, thus forming dots. The dots are generally individual dots and even fine dots that form one piece in some cases. Large particle dots even damage the substrate surface and seriously affect imaging. Thus, most manufacturers require that the dots in the optical elements should have a size not exceeding 5 µm in order to ensure the imaging effect.

In a majority of current optical elements, however, the surfaces need to be coated with various kinds of films to obtain the desired optical performance. This process is typically accomplished by coating one or more metal layers or dielectric films on the surface of an optical part to reduce or increase light reflection, beam splitting, color separation, filtering, polarization and the like. The optical coating process typically adopts vacuum thermal evaporation (deposition) and magnetron sputtering. An effective means for controlling or minimizing dots, however, remains absent in the prior art.

In vacuum thermal evaporation, a substance is heated and evaporated under vacuum conditions to form a vapor and deposited onto the surface of the substrate to form a solid film. The process involves: (1) thermal energy conversion methods of various forms (such as resistance heating, electronic heating, high frequency induction heating, arc heating, laser heating, and the like) are employed to vaporize or sublimate coating material particles into energized gaseous particles; (2) the gaseous particles are transferred to the substrate through a linear movement substantially without collision; (3) the particles are deposited on the surface of the substrate and condensed into a film; and (4) the component atoms of the film rearrange or undergo chemical bonding. Since the heating and condensation processes cannot be absolutely uniform, large droplets or particles inevitably appear. The dot defect in the optical coating cannot be effectively controlled, and dots with a particle size exceeding 5 µm are likely to appear. This is unacceptable for high quality imaging.

The magnetron sputtering is a technique that uses charged particles to bombard the target surface in a vacuum to deposit the bombarded particles on the substrate. Magnetron sputtering includes: (1) under the action of an electric field E, electrons collide with argon atoms in the course of moving to the substrate, causing them to be ionized to generate Ar positive ions and new electrons; (2) the new electrons move to the substrate, and the Ar ions accelerate to a cathode target under the action of the electric field and bombard the target surface with high energy to cause sputtering of the target material; and (3) in the sputtered particles, neutral target atoms or molecules are deposited on the substrate to form a film. Similarly, in the process of bombarding the target, large particles are very likely to be generated and deposited on the substrate to form dots, which cannot be effectively controlled and are unacceptable for quality imaging.

In the industrial production of optical lenses and camera modules, there is no effective way to control the generation and quantity of dot defects. This not only reduces the number of products meeting quality standards but also increases production costs. It is, therefore, highly desirable to develop an improved production process that minimizes the presence of dots or altogether eliminates them.

SUMMARY

In view of the above-mentioned shortcomings in the prior art, the first objective of the present invention is to provide an ALD preparation method for minimizing camera module dot defects, which fundamentally eliminates the formation path of dots without generating micron-sized dot defects.

The second objective of the present invention is to provide a multilayer film structure, a package cover plate, a ceramic leadless chip carrier (CLCC) package and a camera module obtained using the above preparation method, which significantly reduces the undesirable dot defects.

In order to achieve the above-mentioned objectives, the present invention adopts the following technical solution, including:

An ALD preparation method for eliminating camera module dot defects includes the following steps:
  S1: placing a base substrate in a reaction chamber, and heating to 100-400° C.;
  S2: introducing a first reaction precursor into the atomic layer reaction chamber to chemically adsorb the first reaction precursor on the base substrate to form a first film layer;
  S3: removing the excess first reaction precursor, and purging with inert gas;
  S4: introducing a second reaction precursor into the reaction chamber to create a reaction between the second reaction precursor and the first reaction precursor chemically adsorbed on the surface of the base substrate to form a first refractive index layer;
  S5: removing the excess second reaction precursor and a by-product of the reaction, and purging with inert gas;
  S6: introducing a third reaction precursor into the reaction chamber to chemically absorb the third reaction precursor on the surface of the first refractive index layer to form a second film layer;

S7: removing the excess third reaction precursor, and purging with inert gas;

S8: introducing a fourth reaction precursor into the atomic layer reaction chamber to create a reaction between the fourth reaction precursor and the third reaction precursor chemically adsorbed on the surface of the first refractive index layer to form a second refractive index layer; wherein the refractive index of the second refractive index layer is greater than the refractive index of the first refractive index layer; and S9: removing the excess fourth reaction precursor and a by-product of the reaction.

Further, the above preparation method further includes: forming an $N^{th}$ refractive index layer on an $(N-1)^{th}$ refractive index layer, wherein N is a positive integer greater than or equal to 3.

Further, in the above preparation method, a refractive index of an even-numbered refractive index layer is greater than a refractive index of an odd-numbered refractive index layer.

Further, in the above preparation method, the first reaction precursor is silane (including monosilane, disilane or other silanes with substituents), and the second reaction precursor is oxygen or ozone. The third reaction precursor is a gas containing titanium, tantalum, or zirconium, and the fourth reaction precursor is water vapor.

Further, in the above preparation method, the base substrate is a glass, crystal or sapphire substrate.

Further, in the above preparation method, the refractive index layer includes any one combination selected from the group consisting of: a combination of a $SiO_2$ low-refractive-index layer L and a $TiO_2$ high-refractive-index layer H; a combination of the $SiO_2$ low-refractive-index layer L and a $Nb_2O_5$ high-refractive-index layer H; a combination of the $SiO_2$ low-refractive-index layer L and a tantalum pentoxide ($Ta_2O_5$) high-refractive-index layer H; a combination of a $MgF_2$ low-refractive-index layer L and the $TiO_2$ high-refractive-index layer H; a combination of the $MgF_2$ low-refractive-index layer L and the $Nb_2O_5$ high-refractive-index layer H; a combination of a $Nb_2O_5$ low-refractive-index layer L and the $Ta_2O_5$ high-refractive-index layer H; a combination of the $MgF_2$ low-refractive-index layer L, an $Al_2O_3$ high-refractive-index layer H, and the $SiO_2$ low-refractive-index layer L; a combination of an $Al_2O_3$ low-refractive-index layer L, a lanthanum titanium oxide (H4) high-refractive-index layer H and the $MgF_2$ low-refractive-index layer L; and a combination of the $Al_2O_3$ low-refractive-index layer L, a $ZrO_2$ high-refractive-index layer H and the $MgF_2$ low-refractive-index layer L.

Further, in the above preparation method, from the upper surface of the base substrate, the odd-numbered refractive index layer is made of silicon oxide, and the even-numbered refractive index layer is made of titanium oxide, tantalum oxide or zirconium oxide.

Further, in the above preparation method, a silicon dioxide layer, a titanium dioxide layer, a silicon dioxide layer, a tantalum pentoxide layer and a silicon dioxide layer are successively arranged from the upper surface of the base substrate.

Further, in the above preparation method, the temperature is preferably 150-250° C.

A multilayer film structure, wherein the multilayer film structure is prepared by the above ALD preparation method.

Further, in the above multilayer film structure, the number of dots with a size greater than or equal to 1 μm is 0.

Further, the ALD preparation method includes performing bombardment modification on the currently deposited layer with plasma after the completion of the deposition of each layer of the film structure and before the deposition of next layer of the film structure.

Further, a surface roughness Ra of the multilayer film structure ranges from 0.01 nm to 20 nm.

A CLCC package cover plate, wherein the CLCC package cover plate includes a cover plate substrate and a functional film covering the cover plate substrate, and the functional film includes a multilayer film structure. The multilayer film structure is deposited by the above ALD preparation method, whereby bombardment modification is performed on the currently deposited layer with plasma after the completion of the deposition of each layer of the film structure and before the deposition of next layer of the film structure. The conventional ALD deposition process is only suitable for single-layer film deposition. During the deposition of the multilayer film structure, after the previous layer of film is deposited, the next layer of film cannot be successfully deposited due to a change in the deposition surface. In the present invention, the multilayer film is successfully deposited through the surface modification by plasma bombardment after each layer of the film structure.

A CLCC package, wherein the CLCC package includes a substrate. A complementary metal oxide semiconductor (CMOS) is attached in the middle of the substrate. A capacitor resistor and a driving motor are attached on the edge of the substrate. A separation wall base is provided on the substrate. A CMOS sensor vacancy, a capacitor resistor vacancy and a driving motor vacancy are provided at positions on the separation wall base corresponding to the CMOS, the capacitor resistor and the driving motor on the substrate, respectively. The cover plate is mounted on the upper surface of the CMOS sensor vacancy.

A camera module, wherein the camera module includes the CLCC package mentioned above.

The advantages of the present invention are as follows:

(1) Through atomic layer deposition, alternate deposition of multiple high-refractive-index and low-refractive-index layers of the optical element can be achieved. The reaction materials are adsorbed and deposited on the base substrate in the reaction chamber in the vapor phase without evaporation or sputtering processes, which eliminates the source of dot defects and avoids the formation of large particle dot defects. This significantly enhances the imaging quality of the camera module so that CVD has practical application in the processing of camera modules.

(2) The product provided by the present invention achieves film coating of the optical element through atomic layer deposition. Without evaporation or sputtering processes, the reaction materials deposited on the base substrate through adsorption to avoid the formation of large particle dot defects, which not only significantly enhances the imaging quality of the camera module but also improves the product quality. Moreover, the optical coating is smoother, has higher firmness and is more practical.

(3) The surface of the cover plate of the present invention is precisely controlled to avoid the formation of large-sized dots on the surface, much lower than the 5 μm requirement in the prior art, which overcomes the adverse factors that limit the improvement of CMOS pixels, and dramatically improves the pixel level of the CLCC package and the camera module.

Reference numerals: 1, substrate; 2, CMOS; 3, capacitor resistor; 4, driving motor; 5, separation wall base; 6, cover plate.

DETAILED DESCRIPTION OF THE EMBODIMENTS

The present invention will be further described hereinafter with reference to the drawings and the embodiments.

An atomic layer deposition (ALD) preparation method for eliminating camera module dot defects includes the following steps:

S1: A base substrate is placed in a reaction chamber and heated to 100-400° C.

S2: A first reaction precursor is introduced into the atomic layer reaction chamber and chemically adsorbed on the base substrate to form a first film layer.

S3: The excess first reaction precursor is removed, and the reaction chamber is purged with inert gas.

S4: A second reaction precursor is introduced into the reaction chamber to create a reaction between the second reaction precursor and the first reaction precursor chemically adsorbed on the surface of the base substrate to form a first refractive index layer.

S5: The excess second reaction precursor and a by-product of the reaction are removed, and the reaction chamber is purged with inert gas.

S6: A third reaction precursor is introduced into the reaction chamber and chemically adsorbed on the surface of the first refractive index layer to form a second film layer.

S7: The excess third reaction precursor is removed, and the reaction chamber is purged with inert gas.

S8: A fourth reaction precursor is introduced into the atomic layer reaction chamber to create a reaction between the fourth reaction precursor and the third reaction precursor chemically adsorbed on the surface of the first refractive index layer to form a second refractive index layer; wherein the refractive index of the second refractive index layer is greater than the refractive index of the first refractive index layer.

S9: The excess fourth reaction precursor and a by-product of the reaction are removed.

Steps S2-S9 can be repeated periodically to prepare a multilayer film with different refractive indices, that is, to form the $N^{th}$ refractive index layer on the $(N-1)^{th}$ refractive index layer, wherein N is a positive integer greater than or equal to 3. Generally, the refractive index of the even-numbered refractive index layer is greater than the refractive index of the odd-numbered refractive index layer. The film layers in this arrangement can increase light transmittance of the film to obtain improved optical properties of the module. Moreover, the ALD method is employed, whereby micron-sized dot defects can be eliminated and the imaging quality is also improved.

The reaction precursor is determined by the required center wavelength and the transmission bandwidth λ according to the selected materials, thicknesses and series connection modes of the film layers. In the present invention, preferably, the first reaction precursor is silane, and the second reaction precursor is oxygen or ozone; and the third reaction precursor is a gas containing titanium, tantalum, or zirconium (such as titanium tetraiodide gas, tantalum pentachloride gas, zirconium tetraiodide gas, or other organic gases containing titanium, tantalum or zirconium), and the fourth reaction precursor is water vapor. The temperature is related to the decomposition temperature of the reaction precursor and the deposition rate, and the temperature is required to be below the decomposition temperature of the reaction precursor but have a certain deposition rate.

The base substrate is a glass, crystal or sapphire substrate.

The refractive index layer includes any one combination selected from the group consisting of: a combination of a $SiO_2$ low-refractive-index layer L and a $TiO_2$ high-refractive-index layer H; a combination of the $SiO_2$ low-refractive-index layer L and a $Nb_2O_5$ high-refractive-index layer H; a combination of the $SiO_2$ low-refractive-index layer L and a $Ta_2O_5$ high-refractive-index layer H; a combination of a $MgF_2$ low-refractive-index layer L and the $TiO_2$ high-refractive-index layer H; a combination of the $MgF_2$ low-refractive-index layer L and the $Nb_2O_5$ high-refractive-index layer H; a combination of a $Nb_2O_5$ low-refractive-index layer L and the $Ta_2O_5$ high-refractive-index layer H; a combination of the $MgF_2$ low-refractive-index layer L, an $Al_2O_3$ high-refractive-index layer H and the $SiO_2$ low-refractive-index layer L; a combination of an $Al_2O_3$ low-refractive-index layer L, a H4 high-refractive-index layer H and the $MgF_2$ low-refractive-index layer L; and, a combination of the $Al_2O_3$ low-refractive-index layer L, a $ZrO_2$ high-refractive-index layer H and the $MgF_2$ low-refractive-index layer L.

In an embodiment, from the upper surface of the base substrate, the odd-numbered refractive index layer is made of silicon oxide, and the even-numbered refractive index layer is made of titanium oxide, tantalum oxide or zirconium oxide.

In another embodiment, a silicon dioxide layer, a titanium dioxide layer, a silicon dioxide layer, a tantalum pentoxide layer and a silicon dioxide layer are successively arranged from the upper surface of the base substrate.

The temperature of step S2 and/or step S4 is preferably 320-370° C. and the temperature of step S6 and/or step S8 is preferably 220-270° C. The raw material gas can be introduced in a pulse mode. The introduction of the gas is controlled by opening and closing an electromagnetic valve and the thickness of the film deposition is controlled by controlling the opening time of the electromagnetic valve.

Figure 1:
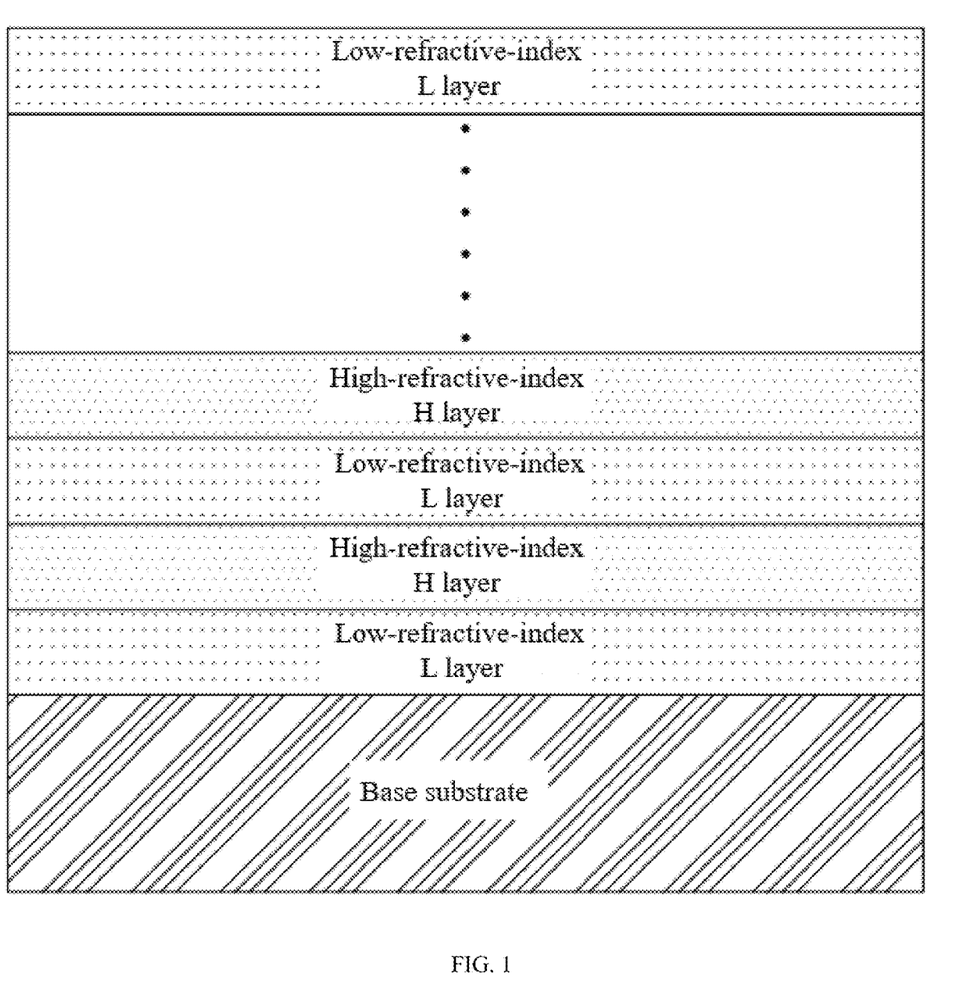
FIG. 1 is a schematic diagram of the multilayer film structure of the present invention.

A multilayer film structure, as shown in FIG. 1, is prepared by the above ALD preparation method, wherein the number of dots with a size greater than or equal to 1 μm is 0, and the surface roughness Ra of the multilayer film structure ranges from 0.01 nm to 20 nm. The ALD preparation method includes performing bombardment modification on the currently deposited layer with plasma after the completion of the deposition of each layer of the film structure and before the deposition of the next layer of the film structure. The plasma used in the modification has a voltage of 100-1000 V and a current of 100-1000 mA, and the time is preferably 1-2 minutes to avoid affecting the performance and thickness of the deposited film layer.

A ceramic leadless chip carrier (CLCC) package cover plate includes a cover plate substrate and a functional film covering the cover plate substrate, and the functional film includes a multilayer film structure. The multilayer film structure is deposited by the above ALD preparation method, which includes performing bombardment modification on the currently deposited layer with plasma after the completion of the deposition of each layer of the film structure and before the deposition of next layer of the film structure. The conventional ALD deposition process is only suitable for single-layer film deposition. During the deposition of the multilayer film structure, after the previous layer of film is deposited, the next layer of film cannot be successfully deposited due to a change in the deposition surface. In the present invention, the multilayer film is successfully deposited through the surface modification by plasma bombardment after each layer of the film structure.

Figure 2:
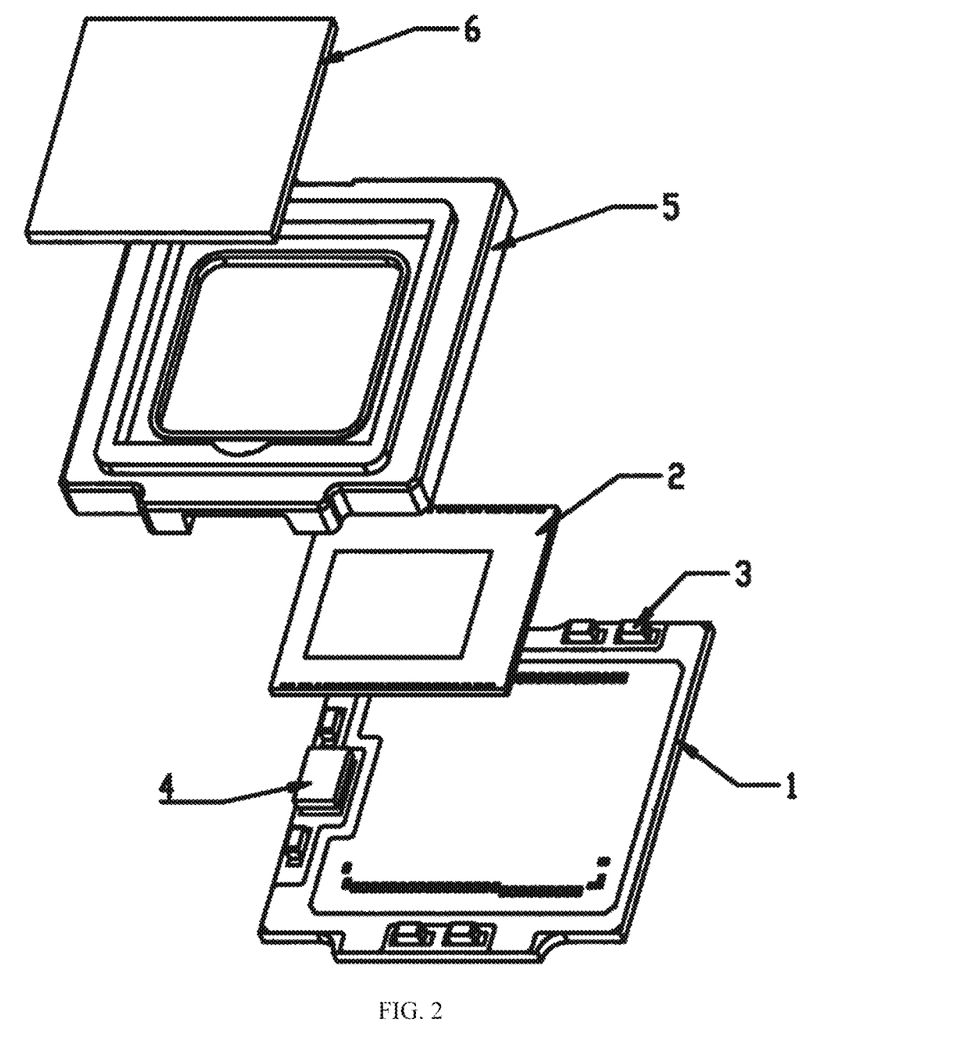
FIG. 2 is a schematic diagram of the structure of the CLCC package of the present invention.
Figure 3:
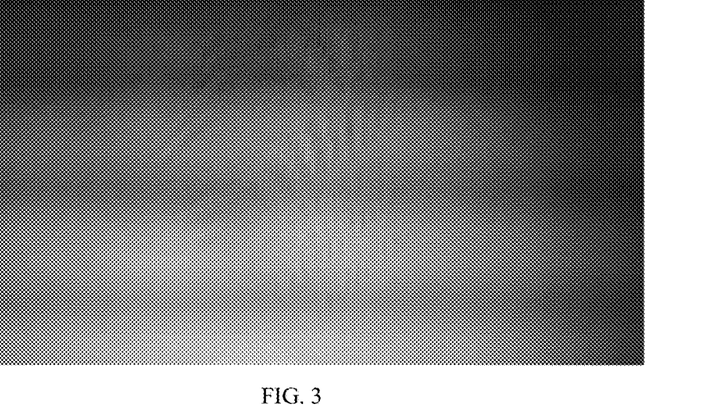
FIG. 3 is a schematic diagram of the cover plate of Embodiment 1 observed under a metallurgical microscope with a 10× ocular lens and a 100× objective lens.
Figure 4:
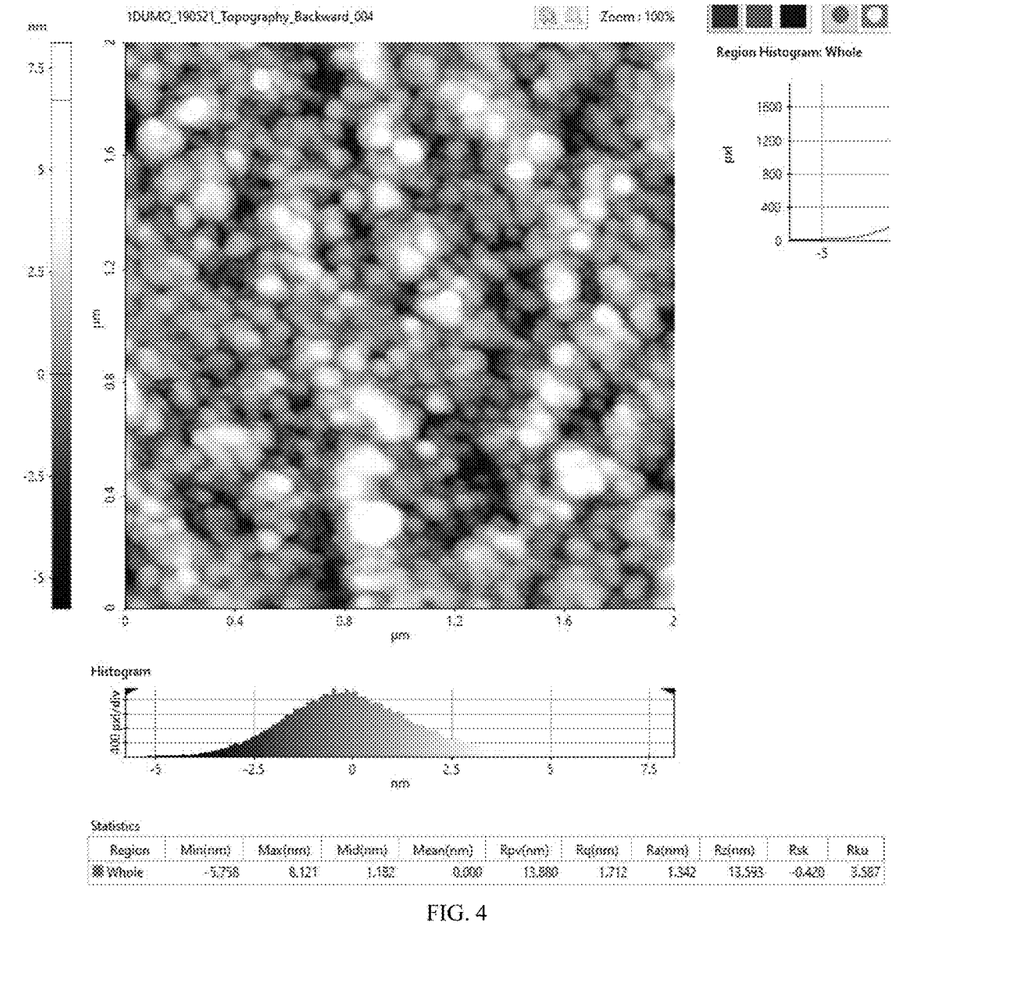
FIG. 4 is an Atomic Force Microscopy (AFM) image of the surface of the cover plate of Embodiment 1.
Figure 5:
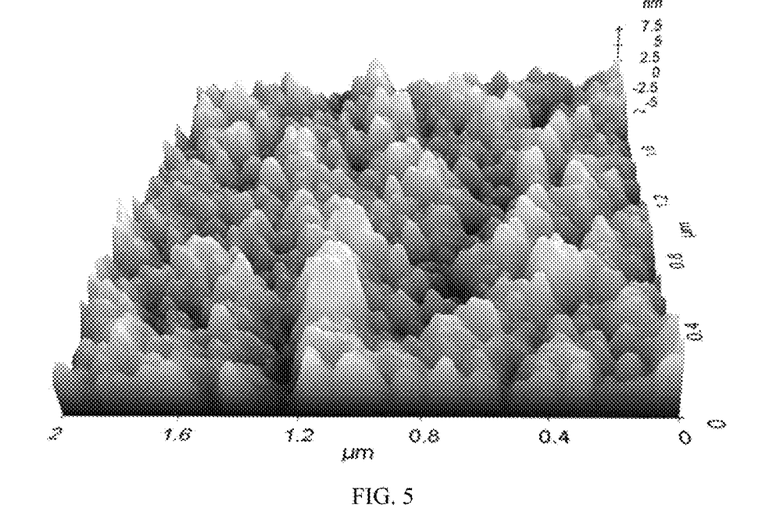
FIG. 5 is a three-dimensional AFM image of the surface of the cover plate of Embodiment 1.

A CLCC package, as shown in FIG. 2, includes the substrate 1. The complementary metal oxide semiconductor (CMOS) 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy.

A camera module includes the CLCC package as described above.

Embodiment 1

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 1 μm, and the roughness Ra of the cover plate 6 is 1.342 nm, as shown in FIGS. 2-5.

The above cover plate is an optical element of the camera module in which a glass substrate is coated with a $SiO_2$ low-refractive-index layer L and a $Ta_2O_5$ high-refractive-index layer H. The low-refractive-index layer L has a thickness of 100-200 nm and a refractive index is 1.46-1.50. The high-refractive-index layer H has a thickness of 80-120 nm and a refractive index of 2.05-2.2.

The above cover plate is prepared by the ALD preparation method, including the following steps:
S1: A glass substrate is firstly placed in an atomic layer reaction chamber, the reaction chamber is evacuated to 0.6 Pa, and the glass substrate is heated to 150° C.

S2: An inert gas is used as a carrier, a first reaction precursor is introduced into the reaction chamber for 30-50 ms and chemically adsorbed on the surface of the base substrate to form a first film layer, wherein the first reaction precursor is silane ($SiH_4$).

S3: The excess first reaction precursor ($SiH_4$) is removed, and the reaction chamber is purged with inert gas (such as helium, argon, and the like) for 20-30 s.

S4: An inert gas is used as a carrier, a second reaction precursor is introduced into the atomic layer reaction chamber for 20 ms to create a reaction between the second reaction precursor and the first film layer to form a $SiO_2$ low-refractive-index layer L, wherein the second reaction precursor is ozone ($O_3$).

S5: After the reaction is completed, the second reaction precursor $O_3$ and the by-product of the reaction between the first reaction precursor ($SiH_4$) and the second reaction precursor $O_3$ are removed, the reaction chamber is purged with inert gas (such as helium, argon, and the like) for 20-30 s, and surface modification is performed by plasma bombardment.

S6: An inert gas is used as a carrier, a third reaction precursor is introduced into the reaction chamber for 20-30 ms and adsorbed on the modified surface of the low-refractive-index layer L to form a second film layer, wherein the third reaction precursor is tantalum pentachloride ($TaCl_5$) gas.

S7: The excess third reaction precursor ($TaCl_5$ gas) is removed, and the reaction chamber is purged with inert gas (such as helium, argon, and the like) for 20-30 s.

S8: An inert gas is used as a carrier, a fourth reaction precursor is introduced into the atomic layer reaction chamber for 20 ms to create a reaction between the fourth reaction precursor and the second film layer to form a $Ta_2O_5$ refractive index layer H, wherein the fourth reaction precursor is water vapor.

S9: The excess fourth reaction precursor (water vapor) and the by-product of the reaction between the third reaction precursor ($TaCl_5$ gas) and the fourth reaction precursor (water vapor), and the reaction chamber is purged with inert gas (such as helium, argon, and the like) for 20-30 s.

In the present embodiment, original substrates with a diameter of 200 mm are produced in batches and 21 substrates are produced in each batch, the particle condition is monitored through a metallographic microscope, no particles with a size greater than 1 μm are observed on all the cover plates, and the qualification rate is 100%.

COMPARATIVE EMBODIMENT

The target product of the present embodiment is the same as that of Embodiment 1, and the adopted vacuum thermal evaporation preparation method includes the following steps:
Step S1: A base glass substrate is firstly placed in a holder, the holder is placed on an umbrella-shaped rack, and the umbrella-shaped rack is placed in a chamber of a coating machine.
Step S2: $SiO_2$ and $TiO_2$ are placed into crucibles at the left side and the right side of the machine chamber, respectively, the door of the machine chamber is closed, the machine chamber is evacuated to 0.0001-0.001 Pa, and the temperature is set within a range of 50-400° C., wherein the internal pressure of the machine chamber is maintained in the evacuation range.

Step S3: An electronic gun at the position where $SiO_2$ is located is turned on. According to a set film thickness, the electronic gun is stopped when the thickness is reached, and the remaining molecules are pumped by the gas after the electronic gun is stopped. An electronic gun at the position where $TiO_2$ is located is automatically turned on to perform film coating.

Step S4: The machine performs cycle coating according to the set number of coating film layers.

Figure 6:
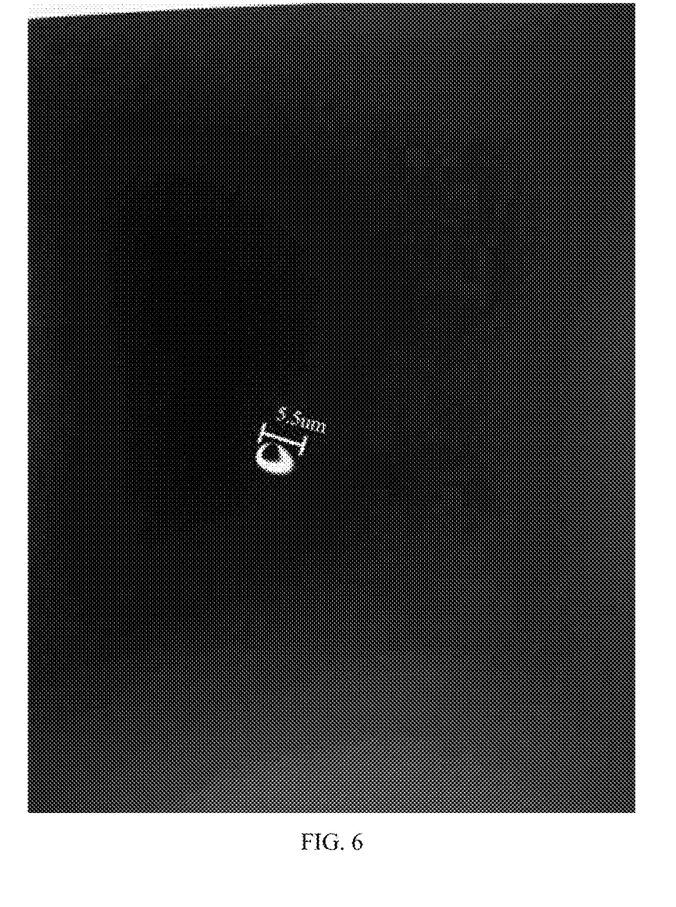
FIG. 6 is a schematic diagram of the cover plate of Comparative Embodiment observed under the metallurgical microscope with the 10× ocular lens and the 100× objective lens.

For the products of the Comparative Embodiment, the dot condition is monitored through the metallographic microscope, and the result thereof is shown in FIG. 6. The dot defect with a particle size greater than or equal to 5 μm can be observed. After batch testing same as that of Embodiment 1, the defect rate of the products obtained using the preparation method due to the dot defect (a particle size greater than or equal to 5 μm) is 70%.

Embodiment 2

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 10 nm, and the roughness Ra of the cover plate 6 is 1.340 nm.

The above cover plate is an optical element of the camera module in which a glass substrate is coated with a $SiO_2$ low-refractive-index layer L and a $TiO_2$ high-refractive-index layer H. The low-refractive-index layer L has a thickness of 100-200 nm and a refractive index of 1.46-1.50. The high-refractive-index layer H has a thickness of 10-50 nm and a refractive index of 2.28-2.35.

The above cover plate is prepared by the ALD preparation method, including the following steps:
  S1: A glass substrate is firstly placed in a reaction chamber, the reaction chamber is evacuated to 0.6 Pa, and the glass substrate is heated to 250° C.
  S2: A first reaction precursor is introduced into the atomic layer reaction chamber, preferably, for 30-50 ms and chemically adsorbed on the surface of the base substrate to form a first film layer, wherein the first reaction precursor is $SiH_4$.
  S3: The excess first reaction precursor ($SiH_4$) is removed, and the reaction chamber is purged with inert gas (such as helium, argon, and the like) for 20-30 s.
  S4: A second reaction precursor is introduced into the reaction chamber for 20 ms to create a reaction between the second reaction precursor and the first film layer to form a $SiO_2$ low-refractive-index layer L, wherein the second reaction precursor is $O_3$.
  S5: After the reaction is completed, the second reaction precursor $O_3$ and the by-product of the reaction between the first reaction precursor ($SiH_4$) and the second reaction precursor $O_3$ are removed, the reaction chamber is purged with inert gas (such as helium, argon, and the like) for 20-30 s, and surface modification is performed by plasma bombardment.
  S6: A third reaction precursor is introduced into the atomic layer reaction chamber, preferably, for 30-50 ms and adsorbed on the surface of the low-refractive-index layer L to form a second film layer, wherein the third reaction precursor is $TiI_4$ gas.
  S7: The excess third reaction precursor ($TiI_4$ gas) is removed, and the reaction chamber is purged with inert gas (such as helium, argon, and the like) for 20-30 s.
  S8: A fourth reaction precursor is introduced into the atomic layer reaction chamber for 35 ms to create a reaction between the fourth reaction precursor and the second film layer to form a $TiO_2$ refractive index layer H, wherein the fourth reaction precursor is water vapor.
  S9: The excess fourth reaction precursor (water vapor) and the by-product of the reaction between the third reaction precursor ($TiI_4$ gas) and the fourth reaction precursor (water vapor) are removed, and the reaction chamber is purged with inert gas (such as helium, argon, and the like) for 20-30 s.

In the present embodiment, the products with a size of 80*76*0.21 mm are produced in batches and 156 substrates are produced in each batch, the particle condition is monitored through the metallographic microscope, no particles with a size greater than 1 μm are observed on all the cover plates, and the qualification rate is 100%. The particle size is further observed, and no particles with a size greater than 10 nm are observed.

Embodiment 3

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 50 nm, and the roughness Ra of the cover plate 6 is 9.440 nm.

The above cover plate is an optical element of the camera module in which a crystal substrate is coated with a $SiO_2$ low-refractive-index layer L and a $ZrO_2$ high-refractive-index layer H. The low-refractive-index layer L has a thickness of 100-200 nm and a refractive index of 1.46-1.50. The high-refractive-index layer H has a thickness of 35-75 nm and a refractive index of 1.98-2.07.

The above cover plate is prepared by the ALD preparation method, including the following steps:
  S1: A crystal substrate is firstly placed in a reaction chamber, the reaction chamber is evacuated to 0.6 Pa, and the crystal substrate is heated to 400° C.
  S2: A first reaction precursor is introduced into the atomic layer reaction chamber in a pulse mode preferably for 15-20 ms and chemically adsorbed on the surface of the base substrate to form a first film layer, wherein the first reaction precursor is $SiH_4$.
  S3: The excess first reaction precursor ($SiH_4$) is removed, and the reaction chamber is purged with inert gas (such as helium, argon, and the like) for 20-30 s.
  S4: A second reaction precursor is introduced into the atomic layer reaction chamber for 15-20 ms to create a reaction between the second reaction precursor and the first film layer to form a $SiO_2$ low-refractive-index layer L, wherein the second reaction precursor is $O_3$.

S5: After the reaction is completed, the second reaction precursor $O_3$ and the by-product of the reaction between the first reaction precursor ($SiH_4$) and the second reaction precursor $O_3$ are removed, the reaction chamber is purged with inert gas (such as helium, argon, and the like) for 20-30 s, and surface modification is performed by plasma bombardment.

S6: A third reaction precursor is introduced into the atomic layer reaction chamber for 15-20 ms and adsorbed on the surface of the low-refractive-index layer L to form a second film layer, wherein the third reaction precursor is $ZrI_4$ gas.

S7: The excess third reaction precursor ($ZrI_4$ gas) is removed, and the reaction chamber is purged with inert gas (such as helium, argon, and the like) for 20-30 s.

S8: A fourth reaction precursor is introduced into the atomic layer reaction chamber for 15-20 ms to create a reaction between the fourth reaction precursor and the second film layer to form a $TiO_2$ refractive index layer H, wherein the fourth reaction precursor is water vapor.

S9: The excess fourth reaction precursor (water vapor) and the by-product of the reaction between the third reaction precursor ($ZrI_4$ gas) and the fourth reaction precursor (water vapor) are removed, and the reaction chamber is purged with inert gas (such as helium, argon, and the like) for 20-30 s.

In the present embodiment, the products with a diameter of 300 mm are produced in batches and 12 substrates are produced in each batch, the particle condition is monitored through a metallographic microscope, no particles with a size greater than 1 μm are observed on all the cover plates, and the qualification rate is 100%. The particle size is further observed, and no particles with a size greater than 50 nm are observed.

Embodiment 4

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 100 nm, and the roughness Ra of the cover plate 6 is 7.581 nm.

The above cover plate is an optical element of the camera module in which a sapphire substrate is coated with a $SiO_2$ low-refractive-index layer L and a $TiO_2$ high-refractive-index layer H. The low-refractive-index layer L has a thickness of 100-200 nm and a refractive index of 1.47-1.51. The high-refractive-index layer H has a thickness of 10-50 nm and a refractive index of 2.28-2.35.

The above cover plate is prepared by the ALD preparation method, including the following steps:

S1: A sapphire substrate is firstly placed in an atomic layer reaction chamber, the reaction chamber is evacuated to 0.6 Pa, and the sapphire substrate is heated to 100° C.

S2: A first reaction precursor is introduced into the atomic layer reaction chamber for 30-50 ms and chemically adsorbed on the surface of the base substrate to form a first film layer, wherein the first reaction precursor is $SiH_4$.

S3: The excess first reaction precursor ($SiH_4$) is removed, and the reaction chamber is purged with inert gas (such as helium, argon, and the like) for 20-30 s.

S4: A second reaction precursor is introduced into the atomic layer reaction chamber for 20-40 ms to create a reaction between the second reaction precursor and the first film layer to form a $SiO_2$ low-refractive-index layer L, wherein the second reaction precursor is $O_2$.

S5: After the reaction is completed, the second reaction precursor $O_3$ and the by-product of the reaction between the first reaction precursor ($SiH_4$) and the second reaction precursor $O_3$ are removed, the reaction chamber is purged with inert gas (such as helium, argon, and the like) for 20-30 s, and surface modification is performed by plasma bombardment.

S6: A third reaction precursor is introduced into the atomic layer reaction chamber for 15-30 ms and adsorbed on the surface of the low-refractive-index layer L to form a second film layer, wherein the third reaction precursor is $TiI_4$ gas.

S7: The excess third reaction precursor ($TiI_4$ gas) is removed, and the reaction chamber is purged with inert gas (such as helium, argon, and the like) for 20-30 s.

S8: A fourth reaction precursor is introduced into the atomic layer reaction chamber for 15-30 ms to create a reaction between the fourth reaction precursor and the second film layer to form a $TiO_2$ refractive index layer H, wherein the fourth reaction precursor is water vapor.

S9: The excess fourth reaction precursor (water vapor) and the by-product of the reaction between the third reaction precursor ($TiI_4$ gas) and the fourth reaction precursor (water vapor) is removed, and the reaction chamber is purged with inert gas (such as helium, argon, and the like) for 20-30 s.

In the present embodiment, the products with a size of 77*77*0.21 mm are produced in batches and 169 substrates are produced in each batch. The particle condition is monitored through the metallographic microscope. No particles with a size greater than 1 μm are observed on all the cover plates, and the qualification rate is 100%. The particle size is further observed and no particles with a size greater than 100 nm are observed.

Embodiment 5

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 10 nm, and the roughness Ra of the cover plate 6 is 0.622 nm.

The above cover plate is an optical element in which a sapphire substrate is coated with a five-layer optical coating. The five-layer optical coating is periodically deposited on the sapphire substrate in the form of alternate low refractive and high refractive indices, and the last layer ends with a low refractive index. The five-layer optical coating from the base substrate successively includes:

a $SiO_2$ low-refractive-index layer L1 with a thickness of 100-200 nm and a refractive index of 1.46-1.50;

a TiO$_2$ high-refractive-index layer H1 with a thickness of 10-50 nm and a refractive index of 2.28-2.35;

a SiO$_2$ low-refractive-index layer L2 with a thickness of 100-200 nm and a refractive index of 1.46-1.50;

a Ta$_2$O$_5$ high-refractive-index layer H2 with a thickness of 80-120 nm and a refractive index of 2.05-2.2; and a SiO$_2$ low-refractive-index layer L3 with a thickness of 5-300 nm and a refractive index of 1.46-1.50.

The above cover plate is prepared by the ALD preparation method, including the following steps:

S1: A sapphire substrate is firstly placed in an atomic layer reaction chamber, the reaction chamber is evacuated to 0.6 Pa, and the sapphire substrate is heated to 200° C.

S2: A first reaction precursor is introduced into the atomic layer reaction chamber for 30-50 ms and chemically adsorbed on the surface of the base substrate to form a first film layer, wherein the first reaction precursor is SiH$_4$.

S3: The excess first reaction precursor (SiH$_4$) is removed, and the reaction chamber is purged with inert gas (such as helium, argon, and the like) for 15 s.

S4: A second reaction precursor is introduced into the atomic layer reaction chamber to create a reaction between the second reaction precursor and the first film layer to form a SiO$_2$ low-refractive-index layer L1, wherein the second reaction precursor is O$_2$.

S5: After the reaction is completed, the second reaction precursor O$_3$ and the by-product of the reaction between the first reaction precursor (SiH$_4$) and the second reaction precursor O$_3$ are removed, the reaction chamber is purged with inert gas (such as helium, argon, and the like) for 15 s, and surface modification is performed by plasma bombardment.

S6: A third reaction precursor is introduced into the atomic layer reaction chamber for 10-30 ms and adsorbed on the surface of the low-refractive-index layer L1 to form a second film layer, wherein the third reaction precursor is TaCl$_5$ gas.

S7: The excess third reaction precursor (TaCl$_5$ gas) is removed, and the reaction chamber is purged with inert gas (such as helium, argon, and the like) for 15 s.

S8: A fourth reaction precursor is introduced into the atomic layer reaction chamber to create a reaction between the fourth reaction precursor and the second film layer to form a TiO$_2$ refractive index layer H1, wherein the fourth reaction precursor is water vapor.

S9: The excess fourth reaction precursor (water vapor) and the by-product of the reaction between the third reaction precursor (TaCl$_5$ gas) and the fourth reaction precursor (water vapor) are removed, the reaction chamber is purged with inert gas (such as helium, argon, and the like) for 15 s, and surface modification is performed by plasma bombardment.

S10: A fifth reaction precursor is introduced into the atomic layer reaction chamber for 30-50 ms and chemically adsorbed on the surface of the base substrate to form a third film layer, wherein the fifth reaction precursor is SiH$_4$.

S11: The excess fifth reaction precursor (SiH$_4$) is removed, and the reaction chamber is purged with inert gas (such as helium, argon, and the like) for 15 s.

S12: A sixth reaction precursor is introduced into the atomic layer reaction chamber to create a reaction between the sixth reaction precursor and the third film layer to form a SiO$_2$ low-refractive-index layer L2, wherein the sixth reaction precursor is O$_3$.

S13: The excess sixth reaction precursor O$_3$ and the by-product of the reaction between the fifth reaction precursor (SiH$_4$) and the sixth reaction precursor O$_3$ are removed, the reaction chamber is purged with inert gas (such as helium, argon, and the like) for 15 s, and surface modification is performed by plasma bombardment.

S14: A seventh reaction precursor is introduced into the atomic layer reaction chamber for 10-30 ms and adsorbed on the surface of the low-refractive-index layer L2 to form a fourth film layer, wherein the seventh reaction precursor is TaCl$_5$ gas.

S15: The excess seventh reaction precursor (TaCl$_5$ gas) is removed, and the reaction chamber is purged with inert gas (such as helium, argon, and the like) for 15 s.

S16: An eighth reaction precursor is introduced into the atomic layer reaction chamber to create a reaction between the eighth reaction precursor and the fourth film layer to form a Ta$_2$O$_5$ refractive index layer H2, wherein the eighth reaction precursor is water vapor.

S17: The excess eighth reaction precursor (water vapor) and the by-product of the reaction between the seventh reaction precursor (TaCl$_5$ gas) and the eighth reaction precursor (water vapor) are removed, the reaction chamber is purged with inert gas (such as helium, argon, and the like) for 15 s, and surface modification is performed by plasma bombardment.

S18: A ninth reaction precursor is introduced into the atomic layer reaction chamber for 10-50 ms and adsorbed on the surface of the base substrate to form a fifth film layer, wherein the ninth reaction precursor is SiH$_4$.

S19: The excess ninth reaction precursor (SiH$_4$) is removed, and the reaction chamber is purged with inert gas (such as helium, argon, and the like) for 15 s.

S20: A tenth reaction precursor is introduced into the atomic layer reaction chamber to create a reaction between the tenth reaction precursor and the fifth film layer to form a SiO$_2$ low-refractive-index layer L3, wherein the tenth reaction precursor is O$_3$.

S21: After the reaction is completed, the excess tenth reaction precursor O$_3$ and the by-product of the reaction between the ninth reaction precursor (SiH$_4$) and the tenth reaction precursor O$_3$ are removed, and the reaction chamber is purged with inert gas (such as helium, argon, and the like) for 15 s.

In the present embodiment, the products with a diameter of 200 mm are produced in batches and 21 substrates are produced in each batch, the particle condition is monitored through the metallographic microscope, no particles with a size greater than or equal to 1 μm are observed on all the cover plates, and the qualification rate is 100%. The particle size is further observed, and no particles with a size greater than 10 nm are observed.

The foregoing embodiments are only used to illustrate the present invention rather than to limit the present invention. Those having ordinary skill in the art can make various changes and modifications without departing from the spirit and scope of the present invention. Therefore, all equivalent technical solutions would fall within the scope of the present invention, and the scope of protection of the present invention shall be defined by the claims.

What is claimed is:

1. An ALD preparation method for eliminating camera module dot defects, comprising the following steps:

S1: placing a base substrate in an atomic layer reaction chamber, and heating the base substrate to a temperature of 100-400° C.;

S2: introducing a first reaction precursor into the atomic layer reaction chamber to chemically adsorb the first reaction precursor on the base substrate to form a first film layer;

S3: removing excess first reaction precursor, and purging the atomic layer reaction chamber with a first inert gas;

S4: introducing a second reaction precursor into the atomic layer reaction chamber to create a first reaction between the second reaction precursor and the first reaction precursor chemically adsorbed on a surface of the base substrate to form a first refractive index layer;

S5: removing excess second reaction precursor and a by-product of the first reaction, and purging the atomic layer reaction chamber with a second inert gas;

S6: introducing a third reaction precursor into the atomic layer reaction chamber to chemically adsorb the third reaction precursor on a surface of the first refractive index layer to form a second film layer;

S7: removing excess third reaction precursor, and purging the atomic layer reaction chamber with a third inert gas;

S8: introducing a fourth reaction precursor into the atomic layer reaction chamber to create a second reaction between the fourth reaction precursor and the third reaction precursor chemically adsorbed on the surface of the first refractive index layer to form a second refractive index layer; wherein a refractive index of the second refractive index layer is greater than a refractive index of the first refractive index layer; and S9: removing excess fourth reaction precursor and a by-product of the second reaction.

2. The ALD preparation method of claim 1, further comprising: forming an $N^{th}$ refractive index layer on an $(N-1)^{th}$ refractive index layer, wherein N is a positive integer greater than or equal to 3.

3. The ALD preparation method of claim 2, wherein, a refractive index of an even-numbered refractive index layer is greater than a refractive index of an odd-numbered refractive index layer.

4. The ALD preparation method of claim 1, wherein, the first reaction precursor is silane; the second reaction precursor is oxygen or ozone; the third reaction precursor is a gas containing titanium, tantalum, or zirconium; and the fourth reaction precursor is water vapor.

5. The ALD preparation method of claim 1, wherein, the base substrate is one selected from the group consisting of a glass substrate, a crystal substrate and a sapphire substrate.

6. The ALD preparation method of claim 3, wherein, each of the first refractive index layer, the second first refractive index layer and the $N^{th}$ refractive index layer comprises one combination selected from the group consisting of:

a combination of a $SiO_2$ low-refractive-index layer and a $TiO_2$ high-refractive-index layer; a combination of the $SiO_2$ low-refractive-index layer and a $Nb_2O_5$ high-refractive-index layer; a combination of the $SiO_2$ low-refractive-index layer and a $Ta_2O_5$ high-refractive-index layer; a combination of a $MgF_2$ low-refractive-index layer and the $TiO_2$ high-refractive-index layer; a combination of the $MgF_2$ low-refractive-index layer and the $Nb_2O_5$ high-refractive-index layer; a combination of a $Nb_2O_5$ low-refractive-index layer and the $Ta_2O_5$ high-refractive-index layer; a combination of the $MgF_2$ low-refractive-index layer, an $Al_2O_3$ high-refractive-index layer, and the $SiO_2$ low-refractive-index layer; a combination of an $Al_2O_3$ low-refractive-index layer, a lanthanum titanium oxide high-refractive-index layer and the $MgF_2$ low-refractive-index layer; and a combination of the $Al_2O_3$ low-refractive-index layer, a $ZrO_2$ high-refractive-index layer and the $MgF_2$ low-refractive-index layer L.

7. The ALD preparation method of claim 3, wherein, from an upper surface of the base substrate, the odd-numbered refractive index layer is made of silicon oxide, and the even-numbered refractive index layer is made of one selected from the group consisting of titanium oxide, tantalum oxide, and zirconium oxide.

8. The ALD preparation method of claim 3, wherein, a first silicon dioxide layer, a titanium dioxide layer, a silicon dioxide layer, a tantalum pentoxide layer, and a second silicon dioxide layer are successively arranged from an upper surface of the base substrate.

9. The ALD preparation method of claim 4, wherein, in step S1, the temperature is 150-250° C.

10. A multilayer film structure, wherein, the multilayer film structure is prepared by the ALD preparation method of claim 1.

11. The multilayer film structure of claim 10, wherein, in the multilayer film structure, a number of dots with a size greater than or equal to 1 µm is 0.

12. The multilayer film structure of claim 10, wherein, the ALD preparation method comprises: performing a bombardment modification on a currently deposited layer with plasma after a completion of a deposition of an $N^{th}$ layer of the multilayer film structure and before a deposition of an $(N+1)^{th}$ layer of the multilayer film structure.

13. The multilayer film structure of claim 10, wherein, a surface roughness of the multilayer film structure ranges from 0.01 nm to 20 nm.

14. A CLCC package cover plate, comprising:
a cover plate substrate, and
a functional film; wherein
the functional film covers the cover plate substrate;
the functional film comprises a multilayer film structure;
the multilayer film structure is deposited by the ALD preparation method of claim 1; and the ALD preparation method comprises: performing a bombardment modification on a currently deposited layer with plasma after a completion of a deposition of an $N^{th}$ layer of the multilayer film structure and before a deposition of an $(N+1)^{th}$ layer of the multilayer film structure.

15. A CLCC package, comprising a substrate;
wherein
a CMOS is attached in a middle of the substrate;
a capacitor resistor and a driving motor are attached on an edge of the substrate;
a separation wall base is provided on the substrate;
a CMOS sensor vacancy is provided at a first position on the separation wall base, wherein
the first position on the separation wall base corresponds to the CMOS on the substrate, a capacitor resistor vacancy is provided at a second position on the separation wall base, wherein the second position on the separation wall base corresponds to the capacitor resistor on the substrate, and a driving motor vacancy is provided at a third position on the separation wall base, wherein the third position on the separation wall base corresponds to the driving motor on the substrate; and
the CLCC package cover plate of claim 14 is mounted on an upper surface of the CMOS sensor vacancy.

16. A camera module, comprising the CLCC package of claim 15.

17. The multilayer film structure of claim 10, wherein, the ALD preparation method further comprises: forming an $N^{th}$ refractive index layer on an $(N-1)^{th}$ refractive index layer, wherein N is a positive integer greater than or equal to 3.

18. The multilayer film structure of claim 17, wherein, a refractive index of an even-numbered refractive index layer is greater than a refractive index of an odd-numbered refractive index layer.

19. The multilayer film structure of claim 10, wherein, the first reaction precursor is silane; the second reaction precursor is oxygen or ozone; the third reaction precursor is a gas containing titanium, tantalum, or zirconium; and the fourth reaction precursor is water vapor.

20. The multilayer film structure of claim 10, wherein, the base substrate is one selected from the group consisting of a glass substrate, a crystal substrate and a sapphire substrate.

* * * * *